United States Patent [19]
Nakayama et al.

[11] Patent Number: 5,925,310
[45] Date of Patent: Jul. 20, 1999

[54] METHOD OF MAKING A SILICON CARBIDE PRODUCT

[75] Inventors: Takahiro Nakayama; Nobuo Kageyama, both of Takasago; Takashi Chikaso, Toyama, all of Japan

[73] Assignees: Asahi Glass Company Ltd., Tokyo, Japan; Pacific Rundum Company Ltd., Tokyo, Japan

[21] Appl. No.: 08/824,755

[22] Filed: Mar. 26, 1997

[30] Foreign Application Priority Data

Mar. 29, 1996 [JP] Japan .................................. 8-104443

[51] Int. Cl.⁶ .................................................. C04B 35/56
[52] U.S. Cl. .............................. 264/637; 264/48; 264/86; 423/345; 501/86
[58] Field of Search ....................... 264/637, 635, 264/633, 48, 86, 87; 425/380, 466, 467; 423/345; 501/86

[56] References Cited

U.S. PATENT DOCUMENTS

| | | |
|---|---|---|
| 2,964,823 | 12/1960 | Fredriksson . |
| 3,848,040 | 11/1974 | Confer ........................................ 264/86 |
| 4,127,629 | 11/1978 | Weaver et al. . |
| 4,976,903 | 12/1990 | Matsushisa ................................ 264/86 |
| 5,179,049 | 1/1993 | Numata et al. ............................ 501/88 |
| 5,240,671 | 8/1993 | Carey ........................................... 419/9 |
| 5,380,511 | 1/1995 | Arahori .................................... 423/345 |

*Primary Examiner*—R. Bruce Breneman
*Assistant Examiner*—Evelyn Defillo
*Attorney, Agent, or Firm*—Oblon, Spivak, McClelland, Maier & Neustadt, P.C.

[57] ABSTRACT

A method of making a perforated silicon carbide product in a shorter time and with less labor work to achieve a lower cost and high yield. Openings 13a, 13b are previously formed in a mold 11, and inserts 14 are inserted into the openings to project toward the inside of the mold. A slurry 15 composed of a mixture of a silicon carbide powder, an organic binder and water is put in the mold to conduct a slip casting molding method whereby a molded green product with perforation 16 is obtained.

14 Claims, 3 Drawing Sheets

METHOD OF MAKING A SILICON CARBIDE PRODUCT

The present invention relates to a method of making a silicon carbide product having a perforated structure. In particular, it relates to a method suitable for making a silicon carbide product used for a heat treatment apparatus for semiconductors.

In recent years, there has been used silicon carbide of high purity as material for members for heat treatment apparatus for semiconductors, e.g., a wafer boat, a cantilever (an insert/loading member supporting a wafer boat) and so on because the silicon carbide of high purity can prevent contamination of a semiconductor by impurities and has excellent heat-resistant and corrosion-resistant properties in comparison with quartz glass or the like.

Generally, a silicon carbide product of this type is prepared as follows. A slurry obtained by adding an organic binder and pure water to a silicon carbide powder of high impurity is poured in a mold to obtain a green product; a machining is conducted to the green product if necessary; the green product is sintered to obtain a sintered product; molten silicon is impregnated to the sintered product according to demand; and a machining work is conducted to the sintered product.

In silicon carbide products, there is a product provided with an opening for the purpose of reducing the weight and homogeneous reaction gas flow. In a wafer boat as a one-piece molded product, for instance, an opening or openings are formed in a side wall in order to reduce the weight and allow gases to flow uniformly in a space between wafers.

In conventional methods of making a silicon carbide product having a perforated structure, it was general that a machining work was conducted to a green product itself or after the sintering of the green product. Accordingly, there was problems that a time and labor work were necessary for the machining, and further, breakage was apt to occur during machining work, whereby yield of products was decreased and cost for making was increased.

It is an object of the present invention to provide a method of making a silicon carbide product having a perforated structure in a shorter time and with less labor work to achieve a lower cost and high yield.

In accordance with the present invention, there is provided a method of making a silicon carbide product comprising (1) a slurry preparing step of preparing a slurry composed of a mixture of a silicon carbide powder, an organic binder and water, (2) a molding step wherein the slurry is put into a mold made of a water absorbing material; a part of the slurry in contact with the inner surface of the mold is dehydrated and solidified; a part of the slurry which is not solidified and remains in a liquid suspension state is discharged; and a solidified green product is removed from the mold, and (3) a sintering step of sintering the green product, said method being characterized in that an opening is previously formed in the mold; an insert made of a non-water absorbing material is inserted in the opening so as to project in the mold; the slurry is poured into the mold to dehydrate and solidify a part of the slurry which is in contact with the inner surface of the mold; a part of the slurry which is not solidified and remains in a liquid suspension state is discharged; the insert is removed; and the solidified green product is removed from the mold whereby a perforated green product is obtained.

Figure 1A:
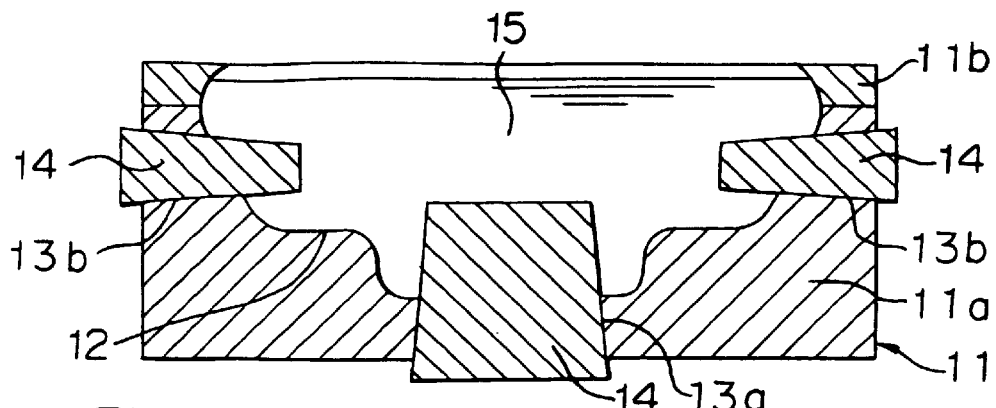
FIGS. 1a to 1d are vertically cross-sectional view for explaining an example of shaping steps in the method of making a silicon carbide product according to the present invention.

In accordance with the present invention, an opening is previously formed in a mold, and an insert made of material having non-water-absorbing properties is inserted in the opening so as to project to the inside of the mold. A slurry is poured into the mold. After the slurry is held for a while, a part of the slurry which is in contact with the inner surface of the mold is dehydrated and solidified due to the water absorbing properties of the mold. However, a part of the slurry in contact with the insert is not solidified and remains in a slurry state because the insert dose not have water absorbing properties. Then, the part in a slurry state is discharged along with another part of unsolidified slurry. When the insert is removed and a solidified green product is taken out from the mold, a green product having a perforated structure is obtainable. The shape of the opening formed by this method is the same as the shape of the insert projecting toward the inside of the mold. The green product is subjected to machining work according to demand, and is sintered whereby a sintered silicon carbide product having a perforated structure can be prepared with high yield and at a low cost.

In accordance with a preferred embodiment of the present invention, the insert is made of resin having elasticity, preferably, a closed-cell type foam resin. In a case that the insert is made of resin having elasticity, when a part of the slurry in contact with the inner surface of the mold slightly shrinks due to dehydration and solidification, a certain degree of shrinkage is permitted owing to the elasticity of the insert whereby occurrence of a crack in the green product can be prevented. However, even in a case of using an insert without having elasticity, occurrence of a crack can be prevented to some extent by contriving the shape of the insert, e.g., the insert having a convergent taper portion.

Further, the method of the present invention is preferably applied to a method of making a silicon carbide product used for a heat treatment apparatus for semiconductors, in particular, a method of making a wafer boat.

The silicon carbide powder as raw material can be prepared by a known method such as Acheson method, CVD method, a low-temperature synthesizing method or the like. However, powder prepared according to Acheson method, which is highly purified by an acid treatment or the like is preferably used from the viewpoint mainly of the cost performance of raw material.

The slurry is prepared by adding and mixing an organic binder and pure water to the refined silicon carbide powder of high purity. As the organic binder, methyl cellulose, polyvinyl acetate emulsion, acrylic resin emulsion, dextrin or the like is preferably used, for example.

A green product is formed with the slurry by a so-called slip casting method.

FIG. 1 shows an example of shaping steps of such method. FIG. 1a shows a state wherein a slurry 15 as raw material is filled in the mold; FIG. 1b shows a state wherein a part of the slurry in contact with the inner surface of the mold is dehydrated and solidified; FIG. 1c shows a state wherein a part of the slurry which is not solidified is discharged and inserts are removed; and FIG. 1d shows a green product which is removed from the mold.

In FIG. 1, reference numeral 11 designates a mold made of material having water absorbing properties, which is constituted by a lower mold 11a and an upper mold 11b. Although plaster is preferably used as the material for the mold 11, porous ceramics having an open-cell structure, resin having water absorbing properties or the like may be used. The mold 11 has in its inside a space 12 whose shape corresponds to the shape of a product to be shaped. The lower mold 11a of the mold 11 is provided with an opening 13a whose shape corresponds to an opening formed in the lower portion of the product to be shaped and openings 13b whose shape corresponds to openings formed in a side portion of the product.

As shown in FIG. 1a, inserts 14 of non-water absorbing properties are fitted to the openings 13a, 13b of the mold 11. The material of the inserts is such that when the slurry 15 is filled in the mold in which the inserts are fitted to the openings of the mold and is held for a while, a part of the slurry in contact with the inserts is not substantially solidified although a part of the slurry in contact with the mold is solidified. Specifically, metal, ceramics and resin are exemplified for the material of the inserts. In particular, resin is preferable as the inserts because it is easy in handling. As concrete examples, there are polypropylene resin, acrylic resin, vinyl chloride resin, polyester resin, polyurethane resin, silicone resin, fluorine resin and epoxy resin. It is more preferable to use resin having elasticity (e.g., elastic rubber having a hardness of 40 or lower defined in JIS K6253), more preferably, a closed-cell type foam resin. Further, the shapes of the openings 13a, 13b and the inserts 14 preferably have a convergent taper portion converging toward the inside of the mold. Use of the inserts 14 of an elastic material which has the above-mentioned tapered shape can permit shrinkage of the solidified product when a part of the slurry in contact with the inner wall of the mold is dehydrated and solidified. Thus, occurrence of crack in the green product is prevented. Further, the inserts 14 can be easily removed in the step described hereinafter.

Then, the slurry 15 prepared by the method described above is filled in the mold 11 after the inserts 14 as described above have been fitted to the openings 13a, 13b of the mold 11.

Figure 1B:
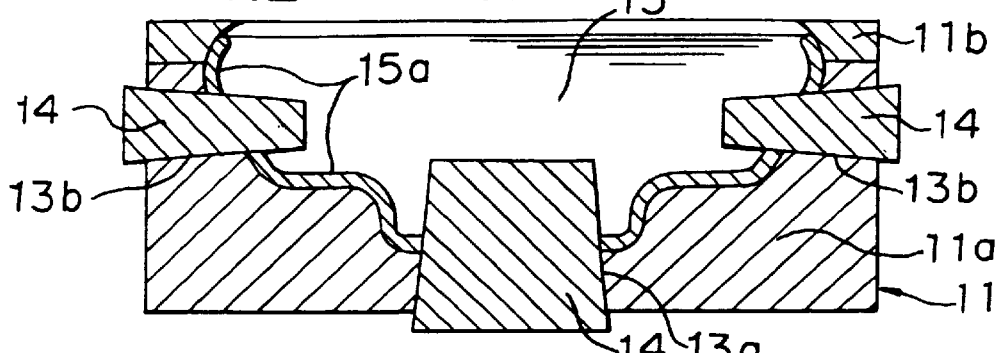
Figure 1C:
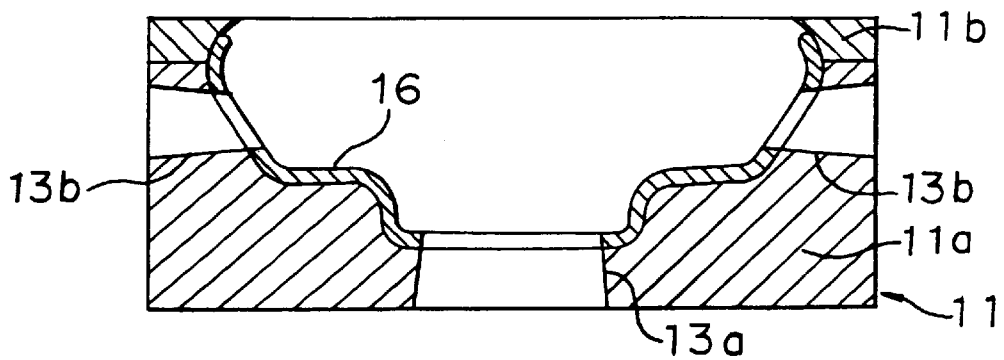

In FIG. 1b, the slurry 15 is dehydrated at a portion in contact with the inner wall of the mold 11 due to the water absorbing properties of the mold 11; a part of the slurry at the portion is gradually aggregated, and a solidified layer 15a is formed along the shape of the inner surface of the mold 11. However, such solidified layer 15a is not formed at portions where the slurry 15 is in contact with the inserts 14 since the inserts have not water absorbing properties.

Then, an unsolidified portion of the slurry 15 is discharged, and the inserts 14 are removed from the opening 13a, 13b whereby a green product 16 is left and dried as a result of the dehydration and solidification of the slurry 15 having a shape corresponding to the shape of the inner surface of the mold.

Figure 1D:
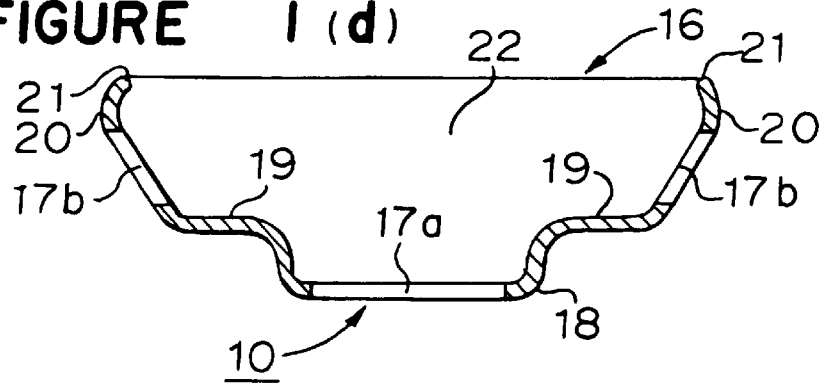

Finally, the upper mold 11b of the mold 11 is removed, and thus obtained green product 16 is taken out from the mold 11. Since the green product 16 slightly shrinks during the dehydration and solidification, it can be easily released from the mold 11. The thus obtained green product 16 has an opening 17a at the bottom and openings 17b at the side portion as shown in FIG. 1d. The method as described above is an example of application to shaping one-piece shell type wafer boat (so-called cassette boat) wherein the green product 16 has a bottom portion 18 with an opening 17a, a step portion 19 which rises from outer edge of the bottom portion 18 and curves outwardly, and an outer peripheral portion 20 with openings 17b, which rises upwardly from outer end of the curved portion of the step portion 19. The free end portion 21 of the outer peripheral portion 20 is slightly extended inwardly. Numeral 22 designates portions of the green product 16, which oppose in the direction perpendicular to the paper surface in the drawing.

The green product 16 after having been shaped is subjected to cutting operations in a green state according to demand. The cutting operations are conducted to a portion to which accuracy is not strictly required, in a green state of the green product since cutting operations are easy. In this specific case, the portions 22 which are needless in the final product are cut off from the green product. In this case, the circular shape of the openings 17a, 17b formed in the green product is the same as the shape of the outer periphery of the inserts. Accordingly, if the outer periphery of the inserts is determined to be a desired shape, time and labor for cutting operations can substantially be reduced. After the cutting operations to the green product 26 have been finished, the green product 16 is sintered. Temperature and time for sintering may be those usually used for silicon carbide material. For instance, it is preferable to sinter the product at 1,500° C.–2,100° C. for 30 min.–400 min. In sintering, when no sintering aid is added, shrinkage does not substantially occur but only bonding between silicon carbide particles takes place, and continuous pores of a porosity of about 10%–30% exist. Accordingly, when a mechanical strength is required, it is preferable to close the pores by impregnating molten silicon of high purity by capillary action.

Then, silicon is impregnated to the sintered product if necessary, and machining operations are conducted to it to obtain a final product. In this specified case, cutting operations are conducted to an inwardly projected corner portion near the step portion 19 and the free end portion 21 inwardly projected from the outer peripheral portion 20 so that grooves 23, 24 for inserting and supporting semiconductor wafers W are formed.

When the impregnation of silicon is conducted, a part of the silicon projects from the pores in the outer surface of the sintered silicon carbide product. Accordingly, it is necessary to remove the projecting silicon by means of sand-blasting or the like. Further, silicon exposed on the surface of the sintered silicon carbide product as a result of the impregnation of silicon has poor corrosion resistance properties to a treatment such as acid cleaning or the like. Accordingly, a thin film of silicon carbide may be formed on the outer surface by CVD method if necessary.

A wafer boat 10 prepared by the above-mentioned method has openings 17a, 17b at its bottom portion 18 and side portion 20. Accordingly, a treatment gas spreads even between adjacent wafers W supported by the grooves 23, 24 whereby conditions for treatment to each of the semiconductor wafers W can be uniform. Further, formation of the openings 17a, 17b reduces the weight of the wafer boat 10 and provides easy handling.

In accordance with the method of the present invention, the openings 17a, 17b are formed by fitting the inserts 14 in the mold at the time of slip casting molding wherein the shape of the openings 17a, 17b can be formed as desired by determining the shape of the inserts. Accordingly, workability is remarkably improves; yield is also increased and manufacturing cost can be reduced in comparison with a conventional method which requires formation of openings by machining a green product or a sintered product, and by processing the edge of the openings formed.

Figure 4:
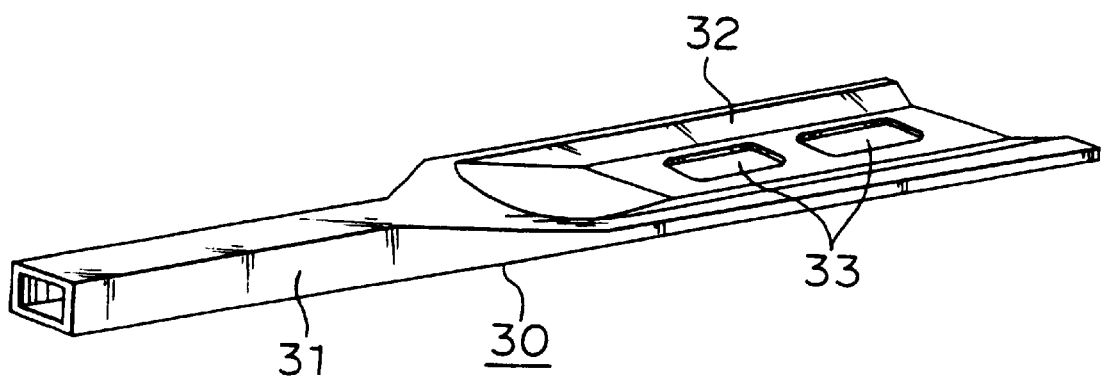
FIG. 4 is a perspective view of a cantilever formed by the method of the present invention.

FIG. 4 shows an example of a cantilever 30 as a shaped product wherein a loading zone 32 is thinner than a grip zone 31 whereby the loading zone 32 is apt to be broken when cutting operations are conducted to form openings 33 in a green state. However, by utilizing the method of the present invention wherein the openings are formed in a final product by inserting inserts in the corresponding openings in the mold, openings 33 can be formed without a risk of breakage and a requirement of reducing the weight can easily be achieved.

EXAMPLES

Example 1

5 parts by weight of methyl cellulose as an organic binder relative to 100 parts by weight of a silicon carbide powder (average particle diameter: about 20 μm) was mixed with 30 parts by weight of pure water to prepare a slurry. By using the slurry, a green product of wafer boat was prepared according to the method described with reference to FIG. 1. Diametrically opposed portion in the side portions of the green product were cut, and then the green product was sintered at 2,000° C. for 60 min. to obtain a sintered product.

Figure 2:
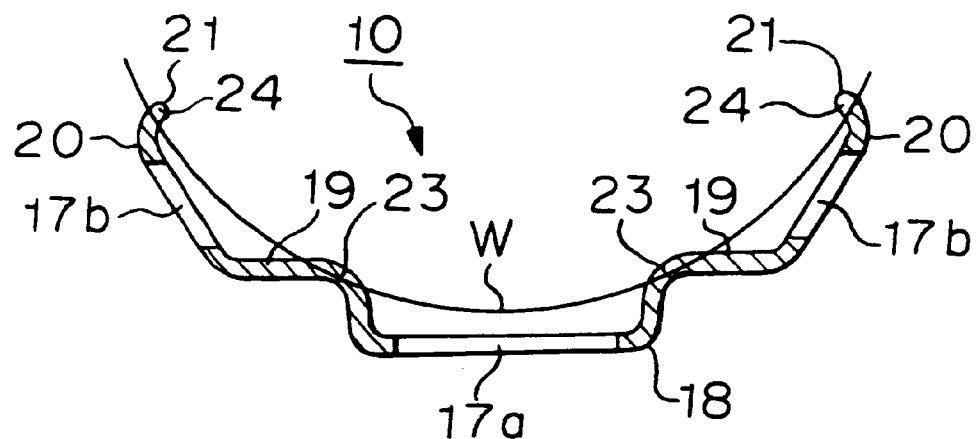
FIG. 2 is a cross-sectional view showing a wafer boat as an example of a silicon carbide product obtained by the method according to the present invention.
Figure 3:
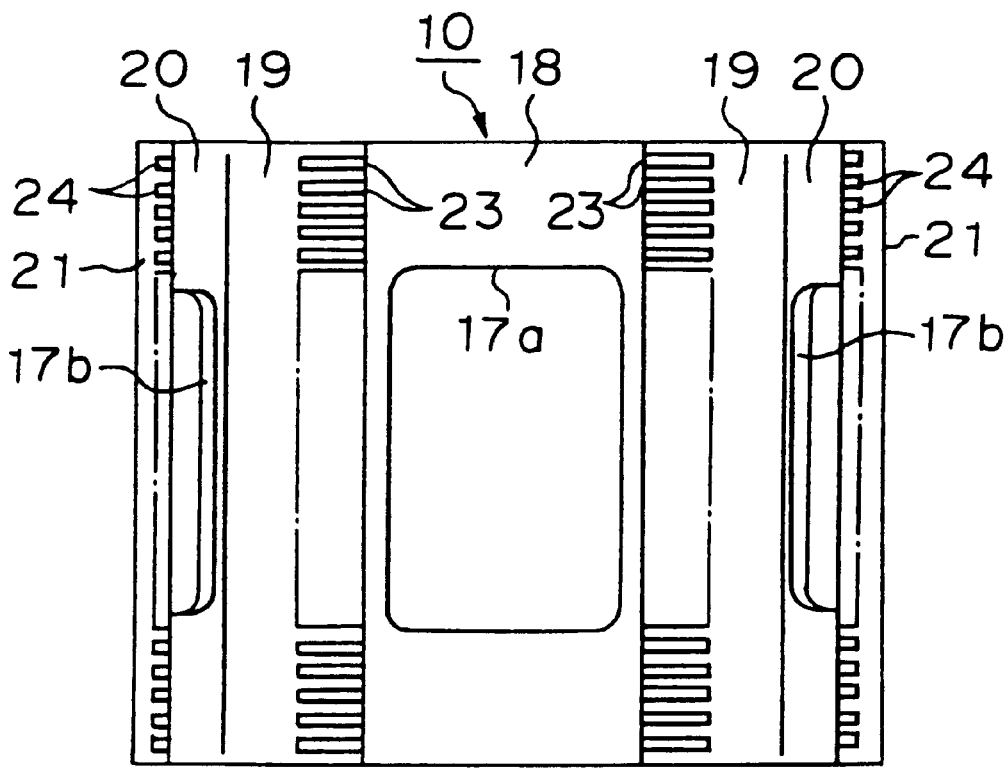
FIG. 3 is a plane view of the wafer boat in FIG. 2.

The sintered product was impregnated with silicon by the method as described in U.S. Pat. No. 5,179,049. Then, machining operations were conducted to form grooves for inserting wafers to thereby prepare one-piece shell type wafer boats (cassette boats) having the shape shown in FIGS. 2 and 3. Yield for manufacturing the wafer boats was 98%. A time required for machining operations including machining in a green state and final machining was 3 hours×person per a final product.

Example 2

Polyvinyl acetate emulsion was used as an organic binder to form cantilevers as green product shown in FIG. 4. The green products were sintered at 1,600° C. for 200 min., followed by impregnating molten silicon. There was found no crack in the vicinity of the openings. Yield for manufacturing was as high as about 95% in comparison with about 50% as the conventional method.

Comparative Example 1

A raw slurry was prepared in the same manner as in Example 1. Green products were formed with the raw slurry by the ordinarily used slip casting method wherein each of the green products has the shape as shown in FIG. 1 provided it has no opening since no inserts 14 was used. Openings were formed in a green state. The green products were sintered under the same conditions as in Example 1 to obtain sintered products. The sintered products were impregnated with silicon by a known method. Then, machining operations were conducted to form wafer boats having the shape shown in FIGS. 2 and 3.

Yield for manufacturing the wafer boats by this method was 55%. A time required for machining was 10 hours×person per a final product.

Comparative Example 2

Figure 5:
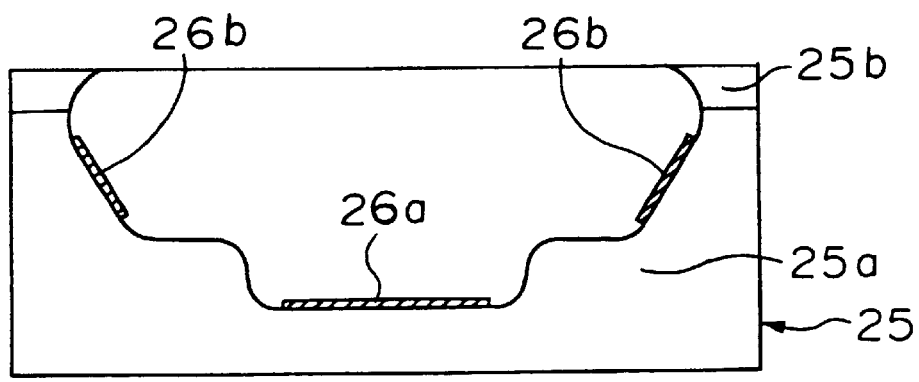
FIG. 5 is a vertically cross-sectional view for explaining a conventional method of making a wafer boat.

Wax layers 26a, 26b were formed on portions of the inner surface of a mold 25 at which openings were intended to form as shown in FIG. 5. Green products were obtained in the same manner as in Comparative Example 1. The green products were sintered to form wafer boats. The presence of the wax layers 26a, 26b in the inner surface of the mold 25 formed openings as a result of using the slip casting method. However, edge-like projections were formed at the periphery of the openings since the slurry was solidified along the periphery of the openings. Accordingly, machining to that portions was necessary. Yield for manufacturing the wafer boats was 70%, and a time required for machining was 7 hours×person per a final product.

In accordance with the present invention, openings are previously formed in a mold at positions corresponding to those of openings to be formed in a final product, and inserts made of material without having no water absorbing properties are fitted to the mold so as to project inwardly from the inner surface of the mold before a raw slurry is poured in the mold according to a slip casting method. Accordingly, a green product with openings is obtainable in a desired shape. Accordingly, workability is improved, yield for manufacturing is increased with the result that manufacturing cost can remarkably reduced in comparison with a conventional method wherein openings are formed by machining a green product or a sintered product.

We claim:

1. In a method of making a silicon carbide product comprising:
   (1) a slurry preparing step of preparing a slurry composed of a mixture of a silicon carbide powder, an organic binder and water,
   (2) a molding step wherein the slurry is put into a mold made of water absorbing material; a part of the slurry in contact with the inner surface of the mold is dehydrated and solidified; a part of the slurry which is not solidified and remains in a liquid suspension state is discharged; and a solidified green product is removed from the mold, and
   (3) a sintering step of sintering the green product, said method being characterized in that an opening is previously formed in the mold; an insert consisting of a non-water-absorbing material is inserted in the opening so as to project in the mold; the slurry is poured into the mold to dehydrate and solidify a part of the slurry which is in contact with the inner surface of the mold; a part of the slurry which is not solidified and remains in a liquid suspension state is discharged; the insert is removed; and the solidified green product is removed from the mold whereby a perforated green product is obtained.

2. The method of making a silicon carbide product according to claim 1, wherein the insert is made of resin having elasticity.

3. The method of making a silicon carbide product according to claim 1, wherein the insert is made of a closed-cell type foam resin.

4. The method of making a silicon carbide product according to claim 1, wherein the method is used for making a silicon carbide product for a heat treatment apparatus for semiconductors.

5. The method of making a silicon carbide product according to claim 1, wherein the method is used for making a wafer boat.

6. The method of making a silicon carbide product according to claim 1, wherein silicon is impregnated in the green product at the same time of sintering the product.

7. The method of making a silicon carbide product according to claim 1, wherein silicon is impregnated in a sintered product obtained by sintering the green product.

8. The method of making a silicon carbide product according to claim 1, wherein the insert has a convergent taper portion which is converging toward the edge of the mold.

9. The method of making a silicon carbide product according to claim 1, wherein the opening formed in the mold has a convergent taper portion which is converging toward the inside of the mold.

10. The method of making a silicon carbide product according to claim 1, which further comprises a step of forming by a CVD method a thin film of silicon carbide on a surface of a sintered product in which silicon is impregnated.

11. The method of making a silicon carbide product according to claim 1, which further comprises a step of removing silicon projecting from a surface of a sintered product.

12. A method of making a silicon carbide product, comprising the steps of:

introducing a slurry comprised of silicon carbide, an organic binder and a liquid vehicle, into a mold formed of a material which is absorptive of the vehicle, the mold having at least one opening closed by an insert made of a material which is non-absorptive of the vehicle;

permitting at least a portion of the vehicle to be absorbed by the material of the mold, thereby producing from the slurry a solidified green product in contact with the mold;

removing the insert from the at least one opening; and sintering the green product.

13. A method of making a silicon carbide product, comprising the steps of:

introducing a slurry comprised of silicon carbide, an organic binder and water, into a mold formed of a material which is water absorptive, the mold having at least one opening closed by an insert consisting of a material which is non-water absorptive;

permitting at least a portion of the water in the slurry to be absorbed by the material of the mold, thereby producing from the slurry a solidified green product in contact with the mold;

removing the insert from the at least one opening;

removing the green product from the mold; and sintering the green product.

14. The method of claim 13, including the further step of discharging a non-absorbed portion of the water in the slurry before said step of removing the insert.

* * * * *